United States Patent [19]

Ohtsuka et al.

[11] Patent Number: 6,107,120
[45] Date of Patent: Aug. 22, 2000

[54] METHOD OF MAKING SEMICONDUCTOR DEVICES HAVING PROTRUDING CONTACTS

[75] Inventors: Takashi Ohtsuka, Toyonaka; Tetsuo Kawakita, Tuzuku-gun; Kazuhiko Matsumura, Kadoma; Hiroaki Fujimoto, Hirakata, all of Japan

[73] Assignee: Matsushita Electric Indsutrial Co., Ltd., Japan

[21] Appl. No.: 09/275,185

[22] Filed: Mar. 23, 1999

Related U.S. Application Data

[62] Division of application No. 08/804,968, Feb. 24, 1997, Pat. No. 5,952,718.

[30] Foreign Application Priority Data

| Feb. 23, 1996 | [JP] | Japan | 8-036429 |
| May 10, 1996 | [JP] | Japan | 8-116083 |
| May 10, 1996 | [JP] | Japan | 8-116084 |

[51] Int. Cl.[7] ............... H01L 21/44; H01L 21/50
[52] U.S. Cl. ............ 438/106; 438/107; 438/118
[58] Field of Search ................ 438/106, 107, 438/108, 118

[56] References Cited

U.S. PATENT DOCUMENTS

| 5,128,746 | 7/1992 | Pennisi et al. | 357/72 |
| 5,289,631 | 3/1994 | Koopman et al. | 257/737 |
| 5,471,092 | 11/1995 | Chan et al. | 257/753 |
| 5,634,268 | 6/1997 | Dalal et al. | 29/840 |
| 5,665,996 | 9/1997 | Williams et al. | 257/766 |

FOREIGN PATENT DOCUMENTS

| 0 327 996 A2 | 8/1989 | European Pat. Off. |
| 0 596 393 A1 | 5/1994 | European Pat. Off. |
| 0 615 283 A1 | 9/1994 | European Pat. Off. |
| 0 675 531 A2 | 10/1995 | European Pat. Off. |
| 0 675 531 A3 | 10/1995 | European Pat. Off. |
| 0 704 895 A2 | 4/1996 | European Pat. Off. |
| 0 704 895 A3 | 4/1996 | European Pat. Off. |
| WO 92/14260 | 8/1992 | WIPO. |

OTHER PUBLICATIONS

R. Aschenbrenner et al., "Electroless Nickel/Copper Plating as a New Bump Metallization", May 1995, IEEE Transactions on Components, Packaging, and Manufacturing Technology—Part B, vol. 18, No. 2, pp. 334–338.

Patent Abstracts of Japan, vol. 006, No. 160 (E–126), Aug. 21, 1982, & JP 57 079649 A (Seiko Epson Corp), May 18, 1982, *abstract*.

Proceedings of the Electronic Components and Technology Conference, Orlando, Jun. 1–4, 1993, No. Conf. 43, Jun. 1, 1993, Institute of Electrical and Electronics Engineers, pp. 579–583, XP000380056 Howell W J et al: "Area Array Interconnection with CU–PI Thin Films on a Multi–Layer Glass–Ceramic Substrate"* p. 581, righ–hand column, last paragraph—p. 582, left–hand column, last paragraph; figure 8*.

Research Disclosure, No. 330, Oct. 1, 1991, p. 778 XP000265038 "Chip Pad Process" * the whole document *.

Patent Abstracts of Japan; vol. 096, No. 010, Oct. 31, 1996 & JP 08 148495 A (Fujitsu Ltd), Jun. 7, 1996 *abstract*.

Patent Abstracts of Japan;, vol. 095, No. 008, Sep. 29, 1995 & JP 07 122591 A (Nippondenso Co Ltd), May 12, 1995 *abstract*.

"Encapsulated Solder Joint for Chip Mounting"; IBM Technical Disclosure Bulletin; vol. 32, No. 108, Mar. 1, 1990, p. 480 XP000097966; *the whole document*.

Patent Abstracts of Japan; vol. 095, No. 006; Jul. 31, 1995 & JP 07 078848 (A Nippondenso Co Ltd); Mar. 20, 1995, *abstract*.

Patent Abstracts of Japan; vol. 012, No. 414, (E–677); Nov. 2, 1998 & JP 63 152136 A (Fuji Electric Co Ltd); Jun. 24, 1988; *abstract*.

Patent Abstracts of Japan; vol. 008, No. 200 (E–266), Sep. 13, 1984, & JP 59 088861 A (Matsushita Denki Sangyo KK); May 22, 1984; *abstract*.

*Primary Examiner*—Charles Bowers, Jr.
*Assistant Examiner*—Evan Pert
*Attorney, Agent, or Firm*—Parkhurst & Wendel, L.L.P.

[57] ABSTRACT

A method of making semiconductor devices with contacts protruding from openings in a passivation layer over an active chip area. Inside each opening, a relatively hard barrier layer is provided and a flash-plated film is applied to subsequently form a relatively soft diffusion barrier layer when a protruding contact is formed. Two semiconductor devices with electrodes are joined by embedding relatively hard electrodes of a first device into relatively soft electrodes of a second device. A reducing agent can be incorporated into an insulating resin applied between semiconductor chips at areas other than the bonded electrodes.

7 Claims, 9 Drawing Sheets

Fig. 1

PRIOR ART

Fig. 2

PRIOR ART

METHOD OF MAKING SEMICONDUCTOR DEVICES HAVING PROTRUDING CONTACTS

This is a Division of application Ser. No. 08/804,968 filed Feb. 24, 1997 now U.S. Pat. No. 5,952,718.

TECHNICAL FIELD

The present invention is directed to semiconductor devices in general, and in particular to semiconductor devices having protruding contacts for coupling those semiconductor devices with substrate electrodes of other semiconductor devices or circuit boards. The present invention is also directed to a method for manufacturing such semiconductor devices.

BACKGROUND ART

Known methods for coupling together two semiconductor devices or a semiconductor device and a circuit board include the tape automated bonding (TAB) method, and flip chip method. The circuit board in this context may include, in addition to printed circuit boards comprising an insulating base board and an electro-conductive substrate electrode, thin film transistor (TFT) elements, piezoelectric elements and any other electrical elements that may be coupled electrically with semiconductor devices.

In the flip chip method, a semiconductor device to be mounted is provided with protruding contacts of solder(e.g., a tin and lead alloy), and is coupled with another semiconductor device or circuit board by means of the protruding contacts.

Figure 1:
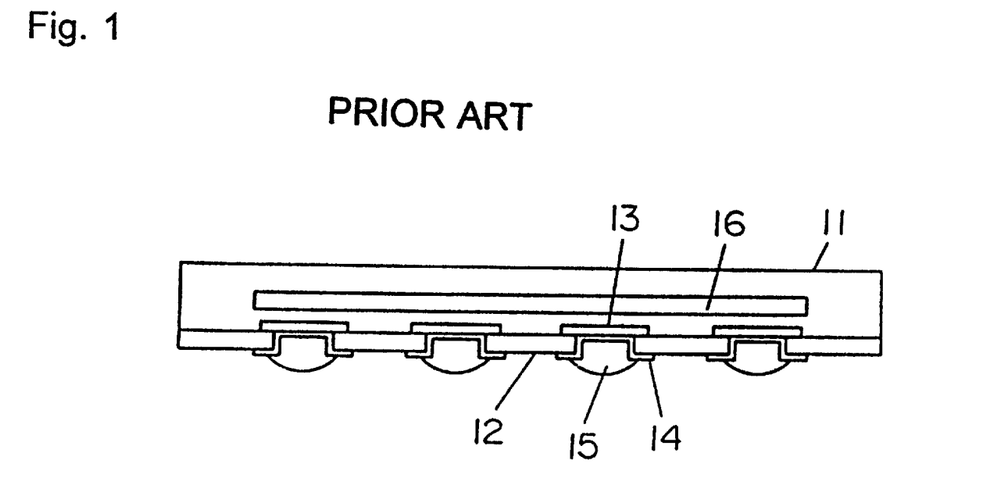
FIG. 1 is a cross sectional view of a prior art semiconductor device.

FIG. 1 is a cross sectional view of a semiconductor device in which a semiconductor chip 11 comprises an active layer 16 containing transistors, wirings, contacts, or the like, and a chip electrode 13. The chip electrode 13 is exposed via an opening formed in a protection layer 12 comprised of a low melting point glass, a silicon nitride layer, or the like, covering the active surface 16 of semiconductor chip 11. A barrier layer 14 comprised of TiW/Au, or the like, is formed inside and around the opening, and a protruding contact 15 is formed on the barrier layer 14 by electrolytic plating or an evaporation process. The protruding contact 15 is connected to other semiconductor chips or circuit boards.

Figure 2:
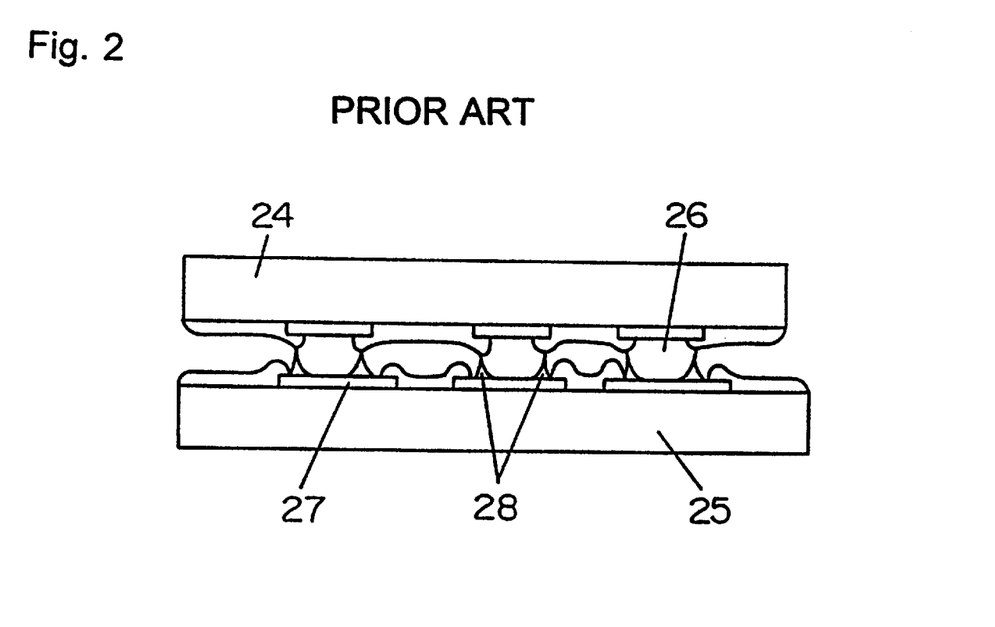
FIG. 2 is a cross sectional view of another prior art semiconductor device.

FIG. 2 is another cross sectional view showing an exemplary combination of semiconductor devices. A semiconductor chip 24 is provided with an Au-surfaced protruding contact 26 and the protruding contact 26 is connected to a substrate electrode 27 made of Al formed on a circuit board 25. An Au—Al alloy layer 28 is formed around the protruding contact 26 and the substrate electrode 27.

However, the conventional semiconductor device described with reference to FIG. 1 has the following drawbacks. The barrier layer 14 is once formed over the whole surface of the semiconductor wafer, and then the undesirable part is etched off, leaving protruding contacts 15. The barrier layer 14 thus has a shape that extends entirely around the opening to prevent overetching. Accordingly, the prior art process is complex. Furthermore, it is difficult in the above described manufacturing process to provide protruding contacts 15 at a fine pitch. This fact limits the possibility of manufacturing smaller semiconductor devices. In the case of a structure as shown in FIG. 1, the pitch between adjacent openings is approximately 20 µm (microns), the diameter of each opening is 100 µm and the height of each protruding contact is 100 µm.

A conventional semiconductor device described with reference to FIG. 2 has the following drawbacks. High temperature heating and heavy loads are applied to semiconductor chip 24 while connecting semiconductor chip 24 to the substrate electrode 27. Such temperatures and loads may lead to breakage and/or deteriorated reliability of semiconductor chip 24, resulting in a reduced manufacturing yield rate of the finished devices.

OBJECTIVE OF THE INVENTION

It is therefore an object of the present invention to provide semiconductor devices suitable for miniaturization, as well as a method for manufacturing such semiconductor devices.

Another object of the present invention is to provide semiconductor devices having strong resistivity against mechanical stress, as well as a method for manufacturing such semiconductor devices.

SUMMARY OF THE INVENTION

Semiconductor devices in accordance with the present invention comprise a protection layer which covers the active surface of a semiconductor chip and is provided with openings corresponding to chip electrodes disposed on the active surface of the semiconductor chip. Provided inside the opening are a barrier layer for covering the chip electrode, a diffusion barrier layer covering the barrier layer and a protruding contact provided on the diffusion barrier layer.

The aggregated layer thickness of the barrier layer and the diffusion barrier layer should preferably be approximately equal to that of the protection layer.

Further, the hardness of the protruding contact should preferably be lower than that of the chip electrode and barrier layer.

Semiconductor devices in accordance with the present invention comprise a first semiconductor device having a first protruding contact and a second semiconductor device or a circuit board having a second protruding contact whose hardness is lower than that of the first protruding contact of the first semiconductor device. The semiconductor device is formed with a structure in which the first protruding contact is embedded in the second protruding contact.

Advantageously, the first and the second semiconductor devices are provided with a protection layer which covers the active surface of the semiconductor chip and has openings corresponding to the chip electrodes disposed on the active surface of the semiconductor chip. Provided inside the openings are a barrier layer for covering the chip electrode and a diffusion barrier layer covering the barrier layer.

The first protruding contact should preferably be comprised of one of gold, palladium, platinum, copper and alloys containing these elements as the principal ingredient. For example, an alloy copper as the principal ingredient would comprise 80% copper and 20% nickel. The second protruding contact should preferably be comprised of one of indium, lead and alloys containing these elements as the principal ingredient. For example, an alloy comprising indium as the principal ingredient would comprise 90% indium and 10% gold.

Semiconductor devices in accordance with the present invention comprise a first and a second semiconductor device, each of which is provided with a protection layer which covers the active surface of the semiconductor chip and is provided with openings corresponding to the chip electrodes disposed on the active surface of the semiconductor chip. Provided inside the openings are a barrier layer for covering the chip electrode and a diffusion barrier layer covering the barrier layer. On the diffusion barrier layer is a protruding contact whose hardness is lower than that of the chip electrode and the barrier layer.

The gap between the first and the second semiconductor devices should preferably be filled with an insulating resin.

Further, the insulating resin should preferably be a thermosetting insulating resin containing a reducing agent.

Furthermore, the mixing ratio of the reduction agent to the insulating resin should preferably be 40–80 volume %.

A method for manufacturing the semiconductor devices according to the present invention comprises the steps of forming by electroless plating a barrier layer and a film for forming a diffusion barrier layer on a chip electrode which is exposed through an opening in the protection layer covering the active surface of the semiconductor chip; and forming a protruding contact on the film for forming a diffusion barrier layer, and a diffusion barrier layer by the mutual diffusion of the protruding contact and the film for forming a diffusion barrier layer.

A method for manufacturing semiconductor devices according to the present invention comprises the steps of aligning a protruding contact formed on a first semiconductor device with the film for forming a diffusion barrier layer on a second semiconductor device or a circuit board; forming a diffusion barrier layer by the mutual diffusion of the protruding contact and the film for forming a diffusion barrier layer; and connecting together the first semiconductor device and the second semiconductor device or a circuit board.

A method for manufacturing semiconductor devices according to the present invention comprises the steps of forming a first and a second protruding contact, each having different hardnesses; aligning the first and the second protruding contacts together; and embedding, at least a part of, the protruding contact of higher hardness in the other protruding contact.

A method for manufacturing semiconductor devices according to the present invention comprises the steps of forming a first and a second protruding contact having different hardnesses on a first semiconductor chip and a second semiconductor chip or a circuit board; aligning the first and the second protruding contacts together and embedding, at least a part of, a protruding contact of higher hardness in the other protruding contact; and applying an insulating resin around the first and the second protruding contacts.

A method for manufacturing semiconductor devices according to the present invention comprises the steps of forming first and second protruding contacts having different hardnesses on a first semiconductor chip and a second semiconductor chip or a circuit board; aligning the protruding contacts with each other; applying an insulating resin around the first and the second protruding contacts and pressing the first and the second semiconductor chips together; and hardening the insulating resin.

A method for manufacturing semiconductor devices according to the present invention comprises the steps of aligning a protruding contact on a first semiconductor device with an electrode on a second semiconductor device or a circuit board; applying an insulating resin containing a reducing agent to a protruding contact on the first semiconductor device and/or an electrode of the second semiconductor device or the circuit board; and hardening the insulating resin.

A method for manufacturing semiconductor devices in accordance with the present invention comprises the steps of forming first and second protruding contacts having different hardnesses respectively on a first semiconductor chip and a second semiconductor chip or a circuit board; aligning said first protruding contact with said second protruding contact; applying an insulating resin containing a reducing agent around said first and/or second protruding contact; connecting said first and second protruding contacts together such that at least a part of the protruding contact of higher hardness is embedded in the other protruding contact; and hardening said insulating resin.

Semiconductor devices in accordance with the present invention comprise a first semiconductor device and a second semiconductor device or a circuit board the electrodes of which are electrically connected to each other, and an insulating resin containing a reducing agent which fills a gap between the first semiconductor device and the second semiconductor device or circuit board.

Still other objects and advantages of the present invention will become readily apparent to those skilled in this art from the following detailed description, wherein we have shown and described only the preferred embodiment of the invention, simply by way of illustration of the best mode contemplated by us of carrying out our invention. As will be realized, the invention is capable of other and different embodiments, and its several details are capable of modifications in various obvious respects, all without departing from the invention. Accordingly, the drawing and description are to be regarded as illustrative in nature, and not as restrictive.

DETAILED DESCRIPTION OF THE PREFERRED EMBODIMENTS OF THE INVENTION

Figure 3:
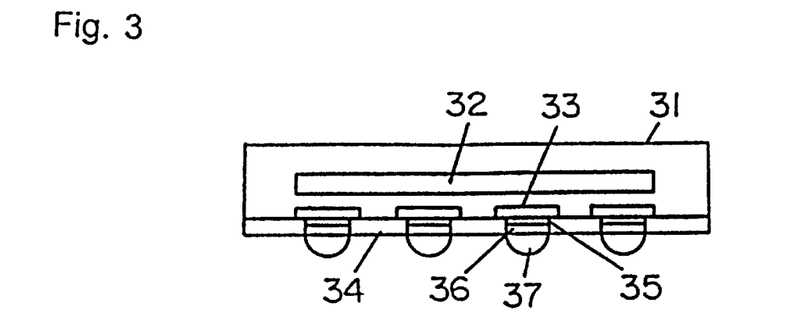
FIG. 3 is a cross sectional view of a semiconductor device according to an embodiment of the present invention.

FIG. 3 shows a cross sectional view of a semiconductor device according to a preferred embodiment of the present invention. Provided inside a semiconductor chip 31 is an active layer 32 comprising transistors, wirings, contacts, or like structures. On the active surface of semiconductor chip 31, chip electrodes 33 such as Al electrodes are formed at intervals of approximately 30 $\mu$m. The chip electrode of the present embodiment comprises an Al material, containing about 0.5% Cu, having a thickness of approximately 0.6 $\mu$m. The main material for chip electrode 31, however, is not limited to Al, but the chip electrode may comprise a material containing Cu as the principal ingredient.

Formed on the active surface of semiconductor chip 31 is a protection layer 34, which is a silicon nitride film approximately 0.8 $\mu$m thick. The protection layer 34 is provided with openings each having a 15 $\mu$m inner diameter disposed at appropriate intervals for exposing the chip electrodes 33 of semiconductor chip 31. The protection layer 34 may also comprise a low melting point glass. Inside each opening, a layer of plated Ni approximately 0.3 $\mu$m thick covers the chip electrode 33 as a barrier layer 35. Further, a diffusion barrier layer 36 approximately 0.5 $\mu$m thick covers the barrier layer 35. On the diffusion barrier layer 36, protruding contact 37, approximately 10 $\mu$m high, is provided.

In the present preferred embodiment, the aggregated thickness of barrier layer 35 and diffusion barrier layer 36 is approximately equal to the thickness of protection layer 34. The barrier layer 35 and diffusion barrier layer 36 should be formed to cover the inside of the opening. The aggregated thickness of barrier layer 35 and diffusion barrier layer 36 may be less than the thickness of protection layer 34. However, it is preferable that the aggregated thickness of barrier layer 35 and diffusion barrier layer 36 be almost identical to the thickness of protection layer 34 thereby creating a stable coupling state when mounting a semiconductor device on a circuit board or connecting semiconductor devices together. Furthermore, it is preferred that the barrier layer 35, diffusion barrier layer 36 and protruding contact 37 each have essentially the same diameter as the inner diameter of the opening.

The protruding contact 37 comprises material such as In, or the like, whose hardness is lower than Al and Ni. By using In, for example, the protruding contact absorbs mechanical stress that is typically transmitted to the active layer through the barrier layer and chip electrode when a semiconductor device is pressed against another electrode.

The above-described mechanical stress transmission phenomenon is described in more detail below. Since the Vickers hardness of Ni, for example, is about 450–500 Hv, and that of In is about 1–4 Hv, the protruding contact 37 of In experiences plastic deformation thereby alleviating the mechanical stress that would normally be transmitted to active layer 32 through barrier layer 35 and chip electrode 33.

Figure 4:
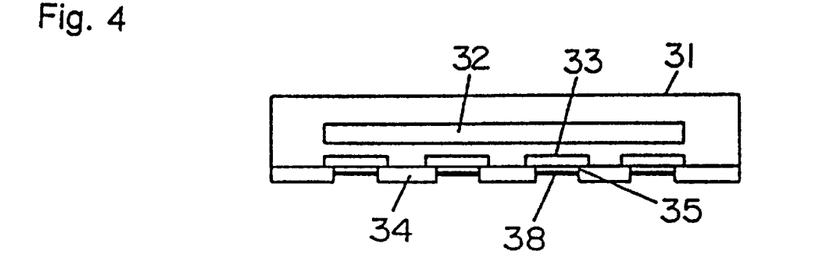
FIG. 4 is shows a process step for manufacturing a semiconductor device according to an embodiment of the present invention.

The diffusion barrier layer 36 is formed by the following process steps. On the barrier layer 35 comprised of plated Ni film, a film for forming a diffusion barrier layer 38 is formed by flash plating Au until it is approximately 0.1 $\mu$m thick, as shown in FIG. 4. The Vickers hardness of Au is approximately 30–40 Hv. When a protruding contact 37 comprised of In contacts the film for forming a diffusion barrier layer 38, an inter-metallic compound of $AuIn_2$ as thick as approximately 0.5 $\mu$m is formed through the mutual diffusion of Au and In. The resulting layer becomes a diffusion barrier layer 36.

The diffusion barrier layer 36 prevents the mutual diffusion of Ni and In and, at the same time, also assures the secure adhesion of barrier layer 35 and protruding contact 37. The material comprising the protruding contact is not limited to In only, but may also include materials whose hardness is lower than that of chip electrode 33 and barrier layer 36. One example of another suitable material is lead. Furthermore, the material comprising the film for forming diffusion barrier layer 38 is not limited to Au only, but may also include Pd or an In/Pb alloy.

As described above, in a semiconductor device according to a preferred embodiment of the present invention, the barrier layer 35 and the diffusion barrier layer 36 are formed only inside the opening of protection layer 34, and the protruding contact 37 is formed on barrier layer 35 via diffusion barrier layer 36. Such a configuration makes it unnecessary to etch a barrier layer that extends beyond the opening. Thus, the size of protruding contact 37 itself, as well as the spacing between the protruding contacts, may be made smaller. In a case of the present embodiment, it is possible to reduce the diameter of the opening to as small as 15 $\mu$m, and the distance between adjacent openings to approximately 30 $\mu$m. As the hardness of protruding contact 37 is lower than that of chip electrode 33 and barrier layer 35, mechanical stress which may arise when a semiconductor device is mounted, for example, on a circuit board, is absorbed by protruding contact 37, and the possibility of mechanical stress reaching the active layer 32 is diminished.

A method for manufacturing such semiconductor devices will be described next with reference to FIG. 4. Spaced apart chip electrodes 33 comprised of Al, or the like, are formed by sputtering on the active surface 32 of semiconductor chip 31. A protection layer 34 of silicon nitride film is formed by CVD on the active surface 32 of semiconductor chip 31. Then, openings are provided in the protection layer 34 at locations corresponding to the spaced apart chip electrodes 33 thus exposing the chip electrodes 33. On the chip electrode 33 exposed through the opening, a Ni film is formed by electroless plating, which film functions as a barrier layer 35. On the barrier layer 35, an Au flash film is formed by electroless plating. The Au film is used for forming a diffusion barrier layer 38 for providing a diffusion barrier layer 36. Then, on the film for forming a diffusion barrier layer 38, a protruding contact 37 of In is formed.

A process for transcribing or transferring the protruding contacts 37 of In onto a semiconductor chip will be described next with reference to FIGS. 5a–5c.

Figure 5A:
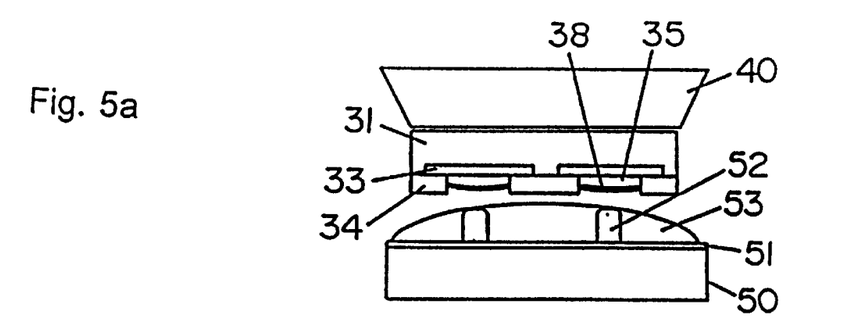
FIGS. 5a–5c show a process for transferring a protruding contact onto a semiconductor device according to the present invention.
Figure 5B:
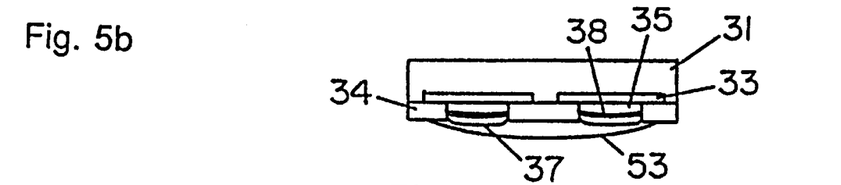

A first semiconductor chip 31 is held by a pressing tool 40, as shown in FIG. 5a. Provided on the semiconductor chip 31, are both a Ni plated film, which functions as barrier layer 35, and an Au flash plated film covering barrier layer 35 which functions as a film for forming a diffusion barrier layer 38. Meanwhile, a piece of In 52 is attached, by, for example, electrolytic plating, to an indium tin oxide (ITO) substrate 51 formed on a $SiO_2$ substrate 50. A reducing agent 53 is applied on the ITO substrate 51 covering the In piece 52. After the In piece 52 is aligned with the film for forming a diffusion barrier layer 38, the semiconductor chip 31 is pressed towards $SiO_2$ substrate 50 by pressing tool 40. As the adhesion strength between In piece 52 and ITO substrate 51 is not very high, In piece 52 is easily transferred onto semiconductor chip 31. Furthermore, since the hardness of In is relatively low, the piece deforms as shown in FIG. 5b. A part of the reduction agent 53 is also transferred to semiconductor chip 31.

Figure 5C:
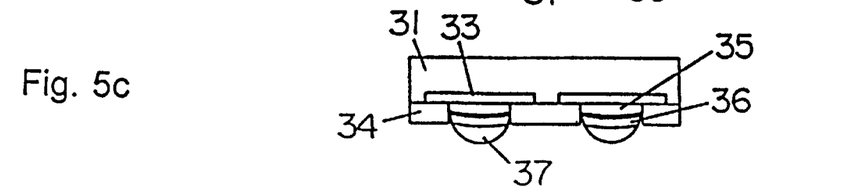

The In piece 52 thus transferred is heated by pressing tool 40, resulting in hemispheric shape, as shown in FIG. 5c, thus providing a protruding contact 37. Diffusion barrier layer 36 is formed through the mutual diffusion of the film for forming a diffusion barrier layer 38 and the In piece 52. During this time, the film for a diffusion barrier layer 38 does not diffuse over the whole In piece 52. Therefore, the hardness of protruding contact 37 remains almost identical to that of In itself. As a result, although the height of protruding contact 37 is low, the deforming properties of the protruding contact 37 are not affected.

By transcribing the In piece 52 onto semiconductor chip 31 with reducing agent 53 applied in advance, oxidized materials existing between the In piece 52 and the Au flash plated layer, which functions as the film for forming a diffusion barrier layer 38, are removed, thereby resulting in improved connection reliability between the In piece 52 and the Au flash plated layer. Furthermore, as oxidized materials covering the surface of the protruding contact are more significantly removed as compared with the case where no reduction agent is applied, the reliability of connection between, for example, the protruding contact 37 and another electrode is improved.

Two semiconductor devices each having a structure as illustrated in FIG. 3 may also be connected together. By so doing, the size of the coupled device is more compact compared to a single semiconductor device having the same function. Accordingly, the coupled device requires less area for mounting. When connecting two semiconductor devices, each of the semiconductor devices mutually receives an external pressing force resulting in mechanical stress. That pressing force is typically transmitted to the active surface 32 of semiconductor chip 31 via chip electrode 33 and barrier layer 35. In semiconductor devices of the present invention where the diameter of an opening is as small as approximately 15 μm, it is feared that the pressure per unit area applied to the active surface 32 will be greater than that in a conventional semiconductor device, and, therefore, the device might be seriously affected by the mechanical stress.

Figure 6:
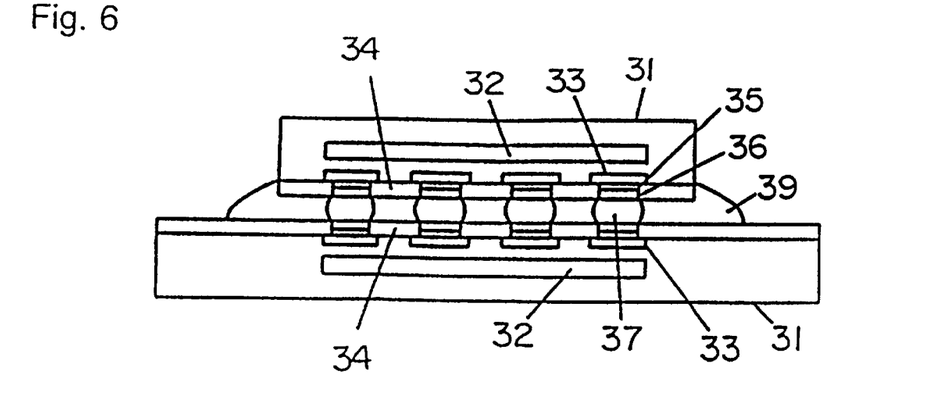
FIG. 6 is a cross sectional view of an exemplary combination of the inventive semiconductor devices according to an embodiment of the present invention.

FIG. 6 illustrates a structure for connecting semiconductor devices in which the above described problem is solved. Each semiconductor device shown in FIG. 6 has an individual structure identical to that of the semiconductor device shown in FIG. 3. A detailed description thereof will therefore be omitted. For convenience, the same numeral designations are used for those components having the same function as in FIG. 3.

In a combination of semiconductor devices as illustrated in FIG. 6, two semiconductor devices are connected together at the protruding contacts 37. A gap between the respective protection layers 34 is filled with an insulating resin 39.

In the above described combination of semiconductor devices, each of the semiconductor devices comprises an opening formed in the protection layer 34, a barrier layer 35 and a diffusion barrier layer 36 each provided inside the opening. The semiconductor devices are connected together by joining respective protruding contacts 37 the hardness of which is lower than that of chip electrode 33 and barrier layer 35.

The semiconductor devices of the above described combination are manufactured by the following process steps. First two semiconductor devices as shown in FIG. 3 are prepared. The protruding contacts 37 of one semiconductor device are aligned with those of the other semiconductor device, and a specified quantity of an insulating resin 39, e.g., epoxy resin, is applied on protection layer 34 of at least one of the semiconductor devices. Then, one of the semiconductor devices is pressed against the other semiconductor device, and heated. The protruding contacts 37 are thus mutually affixed and the insulating resin 39 is hardened. Through the above process steps, the protruding contacts 37 suffer a plastic deformation, thereby alleviating is external pressure that would normally be conveyed to the active layer 32 via barrier layer 35 and chip electrode 33. Warpage of each respective semiconductor device and any excess height of any of protruding contacts 37 are also absorbed by the above process.

In the present embodiment, one of the two semiconductor devices may be replaced with a circuit board. In this case, an electrode on the circuit board and a semiconductor device are connected by means of a protruding contact formed on the semiconductor device.

Figure 7:
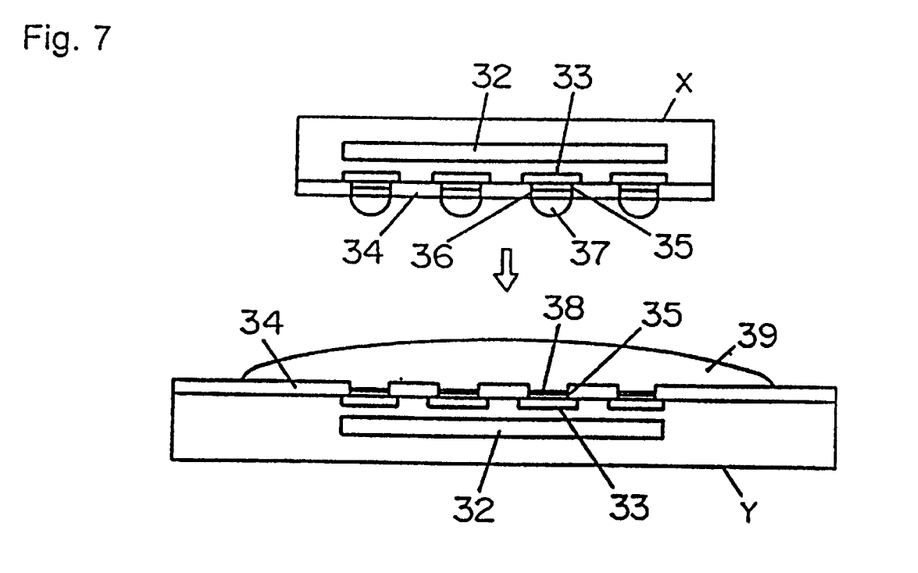
FIG. 7 shows a process for connecting two semiconductor devices according to an embodiment of the present invention.

FIG. 7 shows another method for manufacturing semiconductor devices of a different combination. In the embodiment shown in FIG. 7, a semiconductor device as shown in FIG. 3 (x device) and a sub-semiconductor device (y device), namely a semiconductor device according to FIG. 3 with diffusion barrier layer 36 and protruding contact 37 eliminated therefrom, are prepared. The sub-semiconductor device y is provided with a film for forming a diffusion barrier layer 38 on the barrier layer 35. Protruding contacts 37 of semiconductor device x are aligned with the film for forming a diffusion barrier layer 38 of sub-semiconductor device y. Then, an insulating resin 39 is applied on protection layer 34 of at least one of the semiconductor device x and sub-semiconductor device y. In the present embodiment, the insulating resin 39 is applied on protection layer 34 of sub-semiconductor device y.

At least one of the semiconductor device x and sub-semiconductor device y is then pressed against the other and heated. As a result, the film for forming a diffusion barrier layer 38 or sub-semiconductor device y and the protruding contacts 37 of semiconductor device x mutually diffuse to form a diffusion barrier layer 36 of an increased thickness on barrier layer 35 of sub-semiconductor device y. Thus, the semiconductor device x and the sub-semiconductor device y are attached together by means of protruding contact 37, and the insulating resin 39 is hardened to further strengthen the bond between semiconductor device x and sub-semiconductor device y, thereby resulting in a single-body device.

In place of the sub-semiconductor device y, other electric devices having electrodes provided with a film for forming a diffusion barrier layer 38 such as a circuit board, may be used in the above embodiment.

Next, yet another structure for combining semiconductor devices according to another embodiment will be described.

Figure 8:
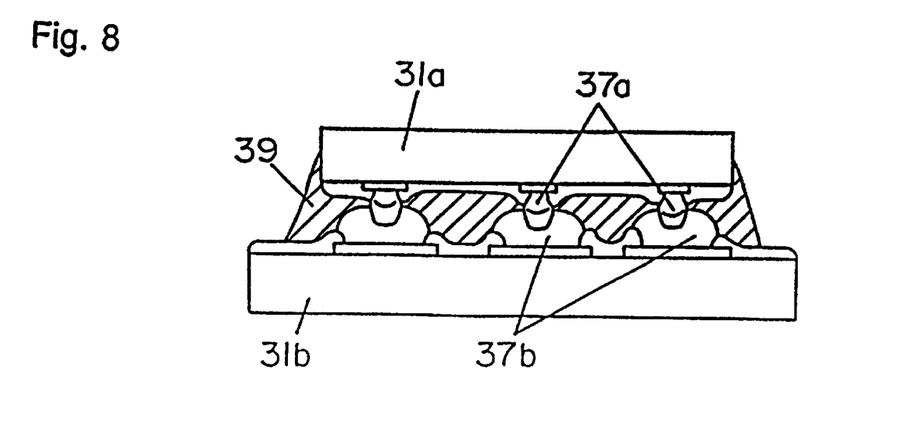
FIG. 8 is a cross sectional view of an exemplary combination of two semiconductor devices according to an embodiment of the present invention.

For convenience, only a semiconductor chip 31, a chip electrode 33 and protruding contacts 37 are shown in FIG. 8 as the constituents of the semiconductor device. However, a semiconductor device as illustrated in FIG. 3 may also be used.

On the surface of a first semiconductor chip 31a a first protruding contact 37a is provided, while on the surface of a second semiconductor chip 31b a second protruding contact 37b is provided. The first protruding contact 37a and the second protruding contact 37b are electrically coupled together. A gap between the first semiconductor chip 31a and the second semiconductor chip 31b is filled with an insulating resin 39. The hardness of the second protruding contact 37b is lower than that of the first protruding contact 37a. Also, the second protruding contact 37b should preferably be formed over a relatively larger area.

Preferably, the first protruding contact 37a comprises Ni with an Au layer, while the second protruding contact 37b comprises Ni with an Au layer plus an In covering. The Vickers hardness of In is as low as approximately 1–4 Hv. Thus, when the first protruding contact 37a and the second protruding contact 37b are mated together, at least a part, e.g. a tip of the first protruding contact 37a, embeds into the second protruding contact 37b. An appropriate hardness level of the second protruding contact 37b is around 1–20 Hv in Vickers hardness for accepting the first protruding contact 37a. Therefore, besides In, an alloy in which In is the principal ingredient, Pb and an alloy in which Pb is the principal ingredient are also all suitable for the second protruding contact 37b. Suitable materials for the first protruding contact 37a include Au, Pd, Pt, Cu and alloys in which these elements are the principal ingredients.

A method for manufacturing semiconductor devices of the above combination will be described next.

Figure 9:
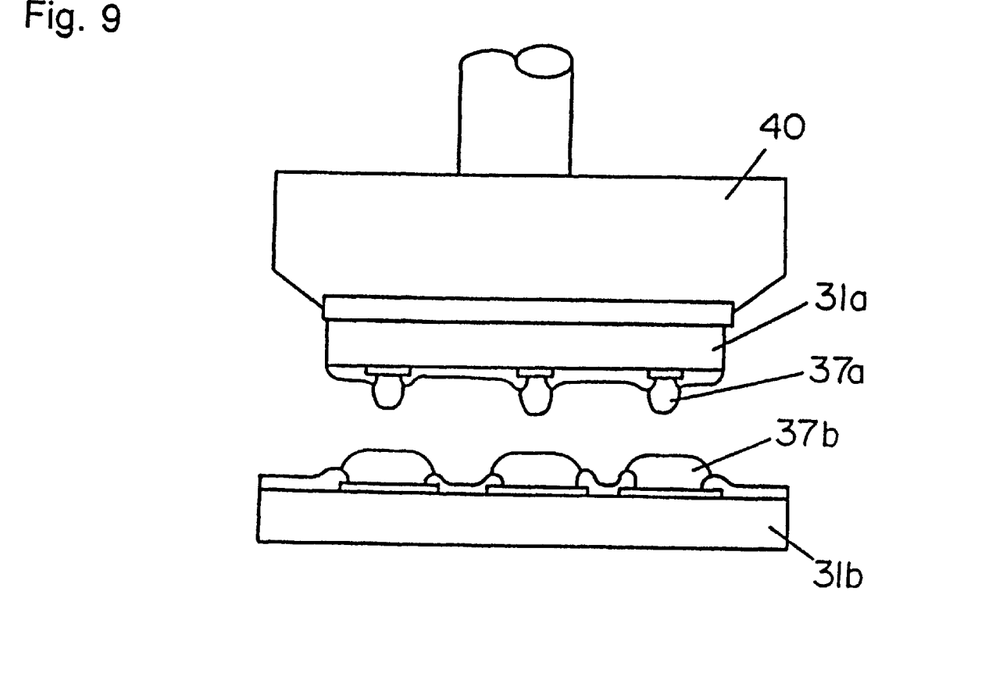
FIGS. 9 through 13 each show a process step for connecting two semiconductor devices according to an embodiment of the present invention.

FIG. 9 is a side view showing how the first protruding contacts 37a are aligned with the second protruding contacts 37b. In the present embodiment, the first protruding contacts 37a are each shaped on an electrode 5–20 μm in diameter by providing, by electroless plating, Ni to a thickness of 3–5 μm and Au to a thickness of 0.2–2 μm. The second protruding contacts 37b are each shaped on an electrode 20–100 μm in diameter by providing, by electroless plating, Ni to a thickness of 2 μm and Au to a thickness of 0.2 μm, and then In to a thickness of 3–5 μm by transcription or by dipping. A pressing tool 40 comprising a vacuum device (not shown) picks up the first semiconductor chip 31a. The pressing tool 40 maintains the vacuum and moves the first semiconductor chip 31a such that the first protruding contacts 37a are aligned with the second protruding contacts 37b.

Figure 10:
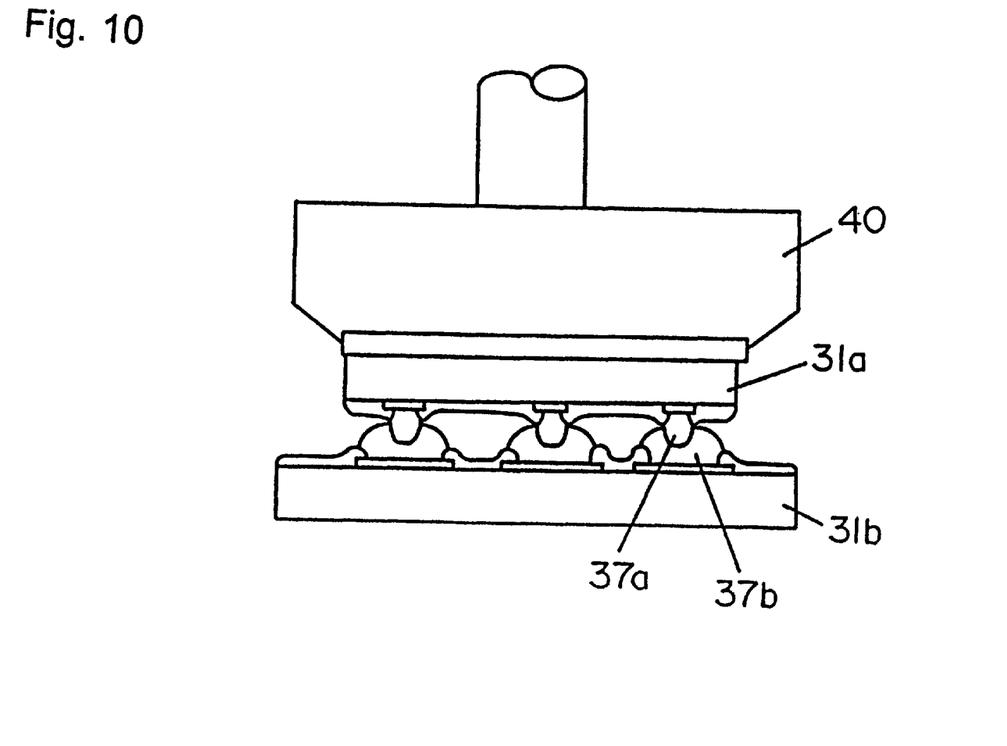

FIG. 10 is a side view showing a process for connecting the first and the second protruding contacts, 37a and 37b. Using the pressing tool 40, the first protruding contacts 37a and/or the second protruding contacts 37b are pressed with a load of less than 5 g per each protruded contact, and are thereby connected. The Vickers hardness of In, being a principal ingredient of the second protruding contact 37b, is as low as approximately 1–4 Hv, whereas that of Ni and Au, which constitute the first protruding contact 37a, is as high as 450–500 Hv and 40–50 Hv, respectively. Therefore, at least a part, e.g. a tip, of the first protruding contacts 37a are easily embedded into the second protruding contacts 37b, and electrical contact is established. The first protruding contacts 37a should preferably be embedded into the second protruded contacts 37b by about 2–4 μm.

Figure 11:
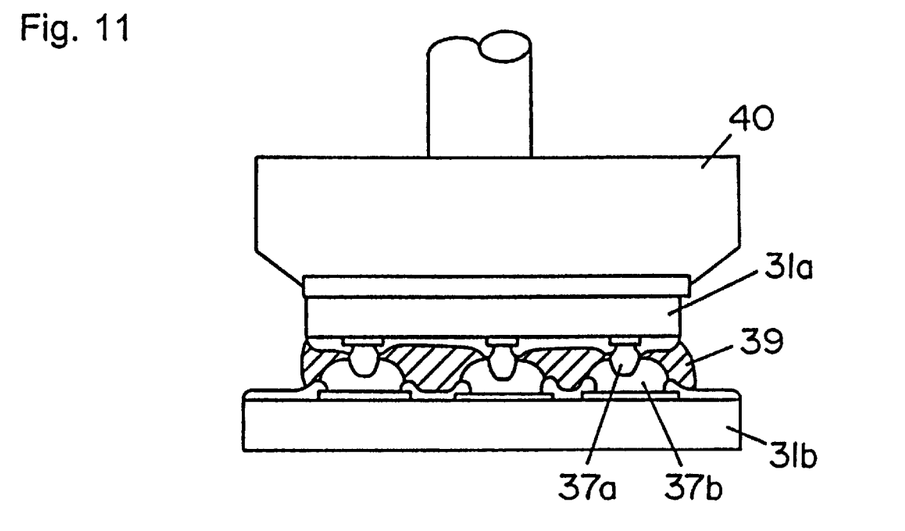

FIG. 11 is a side view showing a process for filling a gap between a first semiconductor chip 31a and a second semiconductor chip 31b with an insulating resin 39. In the process, the insulating resin 39 is filled by taking advantage of the capillary phenomenon between the first semiconductor chip 31a and the second semiconductor chip 31b.

Figure 12:
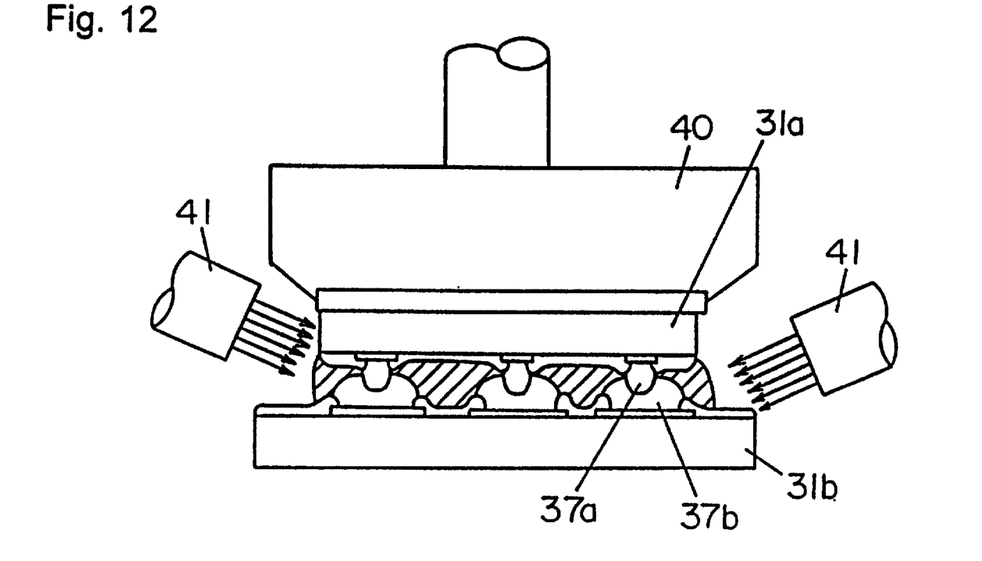

FIG. 12 is a side view showing a process for hardening an insulating resin 39. Ultraviolet rays are irradiated by a UV lamp, preferably from an oblique angle with respect to the coupled first and second semiconductor chips, 31a and 31b.

Figure 13:
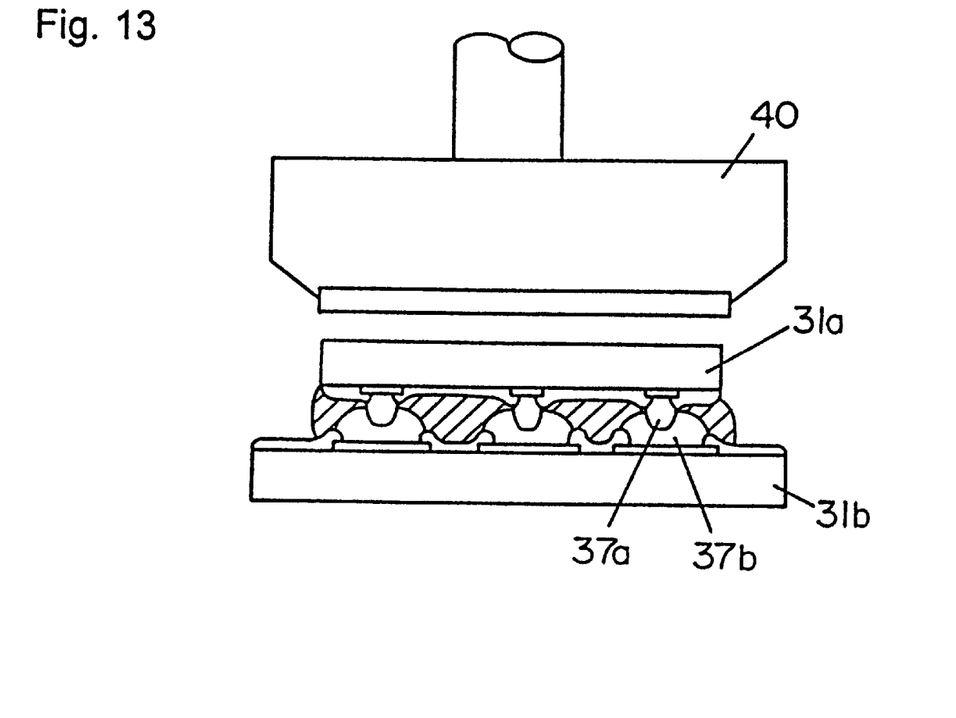

FIG. 13 is a side view showing a process for withdrawing the pressing tool 40 and ultraviolet irradiation UV lamp 41. When the pressing and the UV irradiation are withdrawn, a combination of two semiconductor chips is completed as shown in FIG. 8.

According to the preferred embodiments, since the area of each of the second protruding contacts 37b is larger than that of the first protruding contacts 37a and the hardness of the former is lower, the tip of the first protruding contacts 37a are easily embedded into the second protruding contacts 37b, enabling connection at low temperature and low load. As a result, the risk of deteriorated semiconductor chips resulting from the conventional connection process of two semiconductor chips, which includes high temperatures and high loads, is alleviated. Thus, according to the present invention it is possible to provide coupled semiconductor devices of high reliability. Furthermore, since the first protruding contacts 37a are connected by embedding the same into the second protruding contacts 37b, a reliable connection is assured.

Next, a method for manufacturing semiconductor devices of yet a further different combination is described. In the present embodiment, first protruding contacts 37a comprise Ni, while a second protruding contacts 37b comprise Ni and Au on top of which is added an In—Sn alloy comprising, for example, 90% In and 10% Sn.

More particularly, the first protruding contacts 37a are formed by plating Ni, by electroless plating, to a thickness of about 3 μm; the second protruding contacts 37b are formed by plating, by electroless plating, Ni to a thickness of about 1 μm and Au to a thickness of about 0.2 μm and provided by transcription or dipping over those layers an In-Sn alloy about 3–5 μm thick. The diameter of each of the first protruding contacts 37a is 5–20 μm, and that of each of the second protruding contacts 37b is 20–100 μm. The structure of the rest of the device is the same as that shown in FIG. 11.

Figure 14:
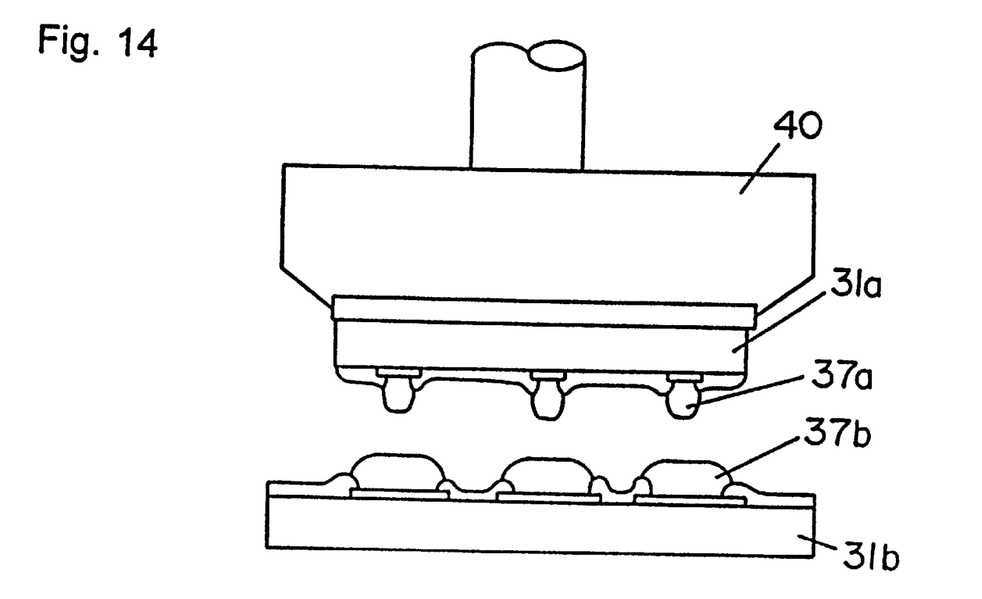
FIGS. 14 through 17 each show a process step for connecting two semiconductor devices according to another embodiment of the present invention.
Figure 15:
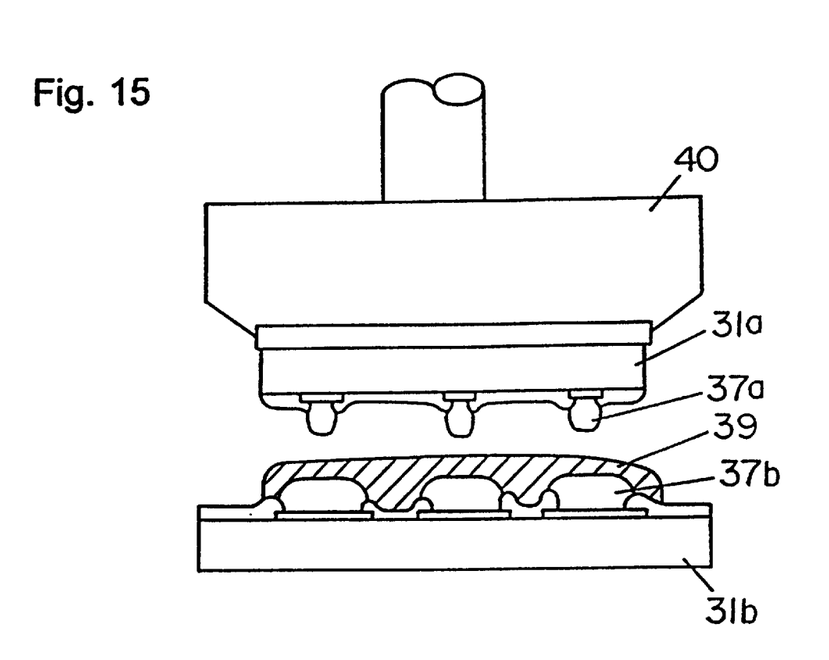
Figure 16:
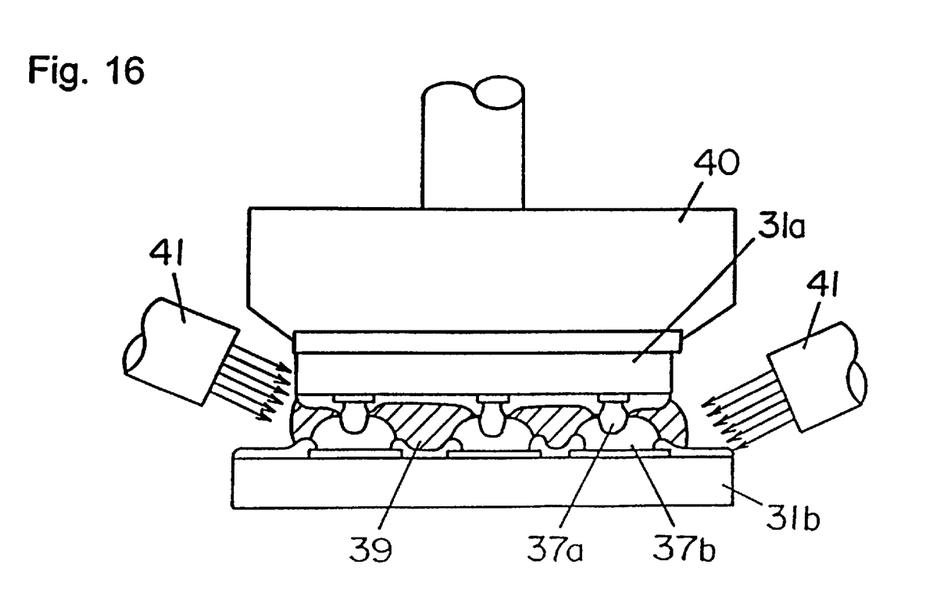
Figure 17:
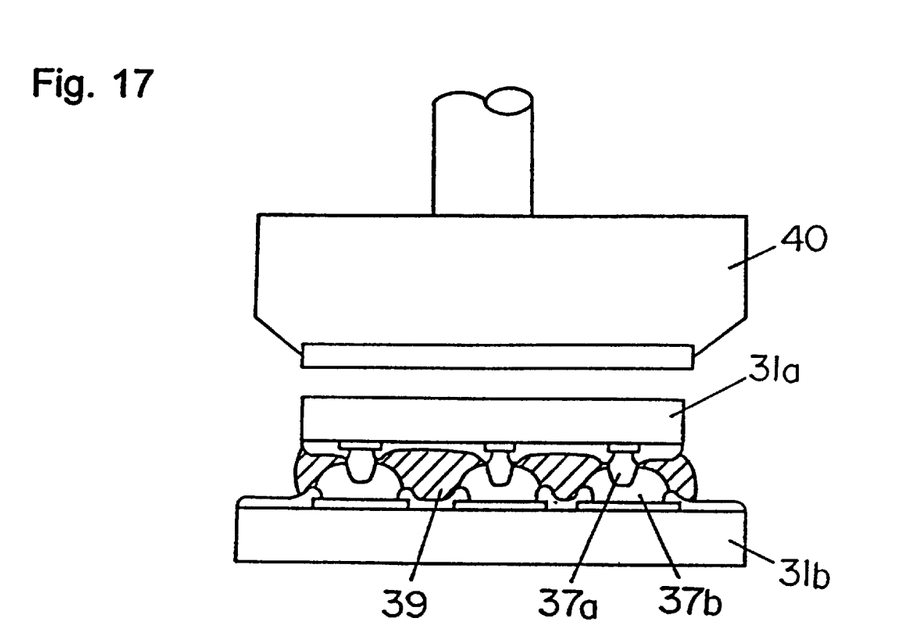

As shown in FIG. 14, the protruding contacts 37a and 37b of the first semiconductor chip 31a and the second semiconductor chip 31b, respectively, are made to engage each other by use of pressing tool 40. FIG. 15 is a side view showing how an insulating resin 39 curable by ultraviolet rays is applied on at least one of the first and the second semiconductor chips. In the present case, the resin 39 is applied on the second semiconductor chip 31b. Namely, according to the present process, an insulating resin 39 is applied on at least one of the semiconductor chips before the first semiconductor chip 31a and the second semiconductor chip 31b are coupled together. FIG. 16 is a side view showing how the first protruding contacts 37a and the second protruding contacts 37b are connected, and the ultraviolet rays are irradiated. Namely, the first and second protruding contacts are pressed together by pressing tool 40 with a load of less than 5 g per each protruding contact, and the tips of the first protruding contacts 37a are embedded into the second protruding contacts 37b by approximately 2 μm. And then, the insulating resin 39 is hardened by UV irradiation from ultraviolet ray lamp 41. FIG. 17 is a side view showing how the pressing tool 40 and the ultraviolet ray lamp 41 are withdrawn. Through the above described process, the first semiconductor chip 31a and the second semiconductor chip 31b are mutually connected together.

According to the present preferred embodiment, the insulating resin 39 is applied before the first protruding contacts 37a and the second protruding contacts 37b are connected together, and then hardened by the UV irradiation. It is therefore relatively easy to place an insulating resin 39 between the first semiconductor chip 31a and the second semiconductor chip 31b.

In a combination where two semiconductor chips are stacked, it is preferable to remove with a reducing agent, in advance, the oxidized materials covering the surface of a protruding contact 37. An example of such a reducing agent includes a reducing agent containing abietic acid as the principal ingredient. For example, a compound comprising more than 80% abietic acid would be suitable.

The reducing agent used for removing oxidized materials needs to be washed off or evaporated by heat after the coupling process is finished. However, it was found that the mounting efficiency in semiconductor devices coupled together in accordance with the present invention was low since it took a relatively long time to completely discharge or wash off the reducing agent, because the height and/or pitch of the protruding contacts are smaller in coupled semiconductor devices of the present invention.

The above described drawback of the present invention may be overcome by using an insulating resin containing a reducing agent as the insulating resin in connecting two semiconductor devices.

Figure 18:
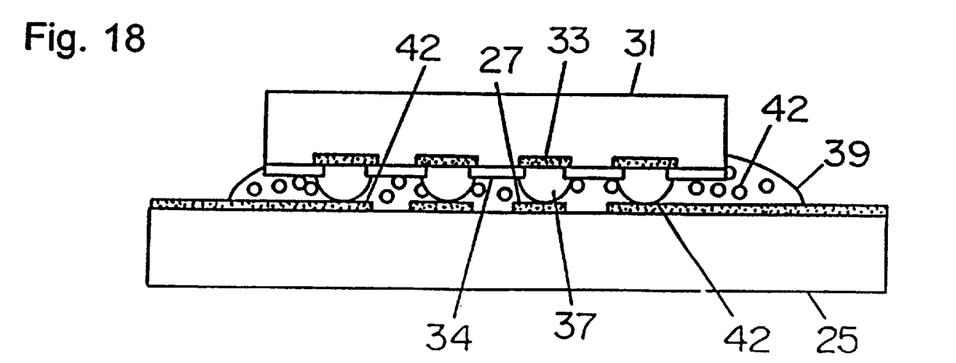
FIG. 18 is a cross sectional view of an exemplary connection of a semiconductor device and a circuit board according to an embodiment of the present invention.

FIG. 18 is a side view showing how a semiconductor device of the invention, e.g. FIG. 3, is mounted on a circuit board 25 by a face-down bonding method. In the present case, protruding contacts 37 comprise a low melting point metal such as a Sn—Pb solder, having a height lower than 10 μm, formed on chip electrode 33 by electrolytic plating, evaporation or any other appropriate method. The circuit board 25 comprises a glass ceramic substrate, or the like, and substrate electrodes 27 formed on the surface thereof. In the present case, the substrate electrodes 27 comprise a metal film of Cu and Ni, covered by Sn—Pb solder several microns thick.

A gap between a protection layer 34 of semiconductor device 31 and the circuit board 25 is filled with an insulating resin 39. The insulating resin 39 comprises a thermosetting resin like epoxy resin having a viscosity of approximately 1500 c.p.s. containing a reducing agent 42 for removing oxidized materials such as a reducing agent in which abietic acid is the principal ingredient. The protruding contacts 37 and the substrate electrodes 27 are electrically coupled together. The reducing agent 42 is crushed between the protruding contacts 37 and the substrate electrodes 27, and oxidized materials covering the surface of protruding contacts 37 or substrate electrodes 27 are removed as a result of the crushing and dispersing of reducing agent 42.

The reducing agent 42 is provided by spraying a wash-free type reducing agent in an active atmosphere maintained at a temperature of approximately 200° C., and rapidly cooling the reducing agent thereby hardening at least the surface thereof to yield a desired shape. Or, the reducing agent 42 may be a chunk-shaped reducing agent with its surface coated with an insulating resin such as epoxy resin or a thermoplastic resin such as polyamide, or a powdered or liquidized reducing agent sealed into a capsule made of an insulating resin or a thermoplastic resin. If the surface of reducing agent 42 is coated with an insulating resin having the same properties as the insulating resin 39, or the reducing agent 42 is sealed in a capsule having the same properties as the insulating resin 39, adhesion between the reducing agent 42 and the insulating resin 39 is increased, thereby reducing the necessary pressure when mounting a semiconductor device on a circuit board.

The mixture ratio of the reducing agent 42 in the insulating resin 39 is within a range of 40–80 in volume %. Within that range, the reducing agent 42 exists to a very high probability between the protruding contact 37 and its counterpart substrate electrodes 27. In the case when the mixture ratio is lower than 40 volume %, the quantity of reducing agent 42 is too small to completely remove oxidized materials. On the other hand, if the mixture ratio exceeds 80 volume % the protective effect of the insulating resin 39 may not be sufficient.

Figure 19A:
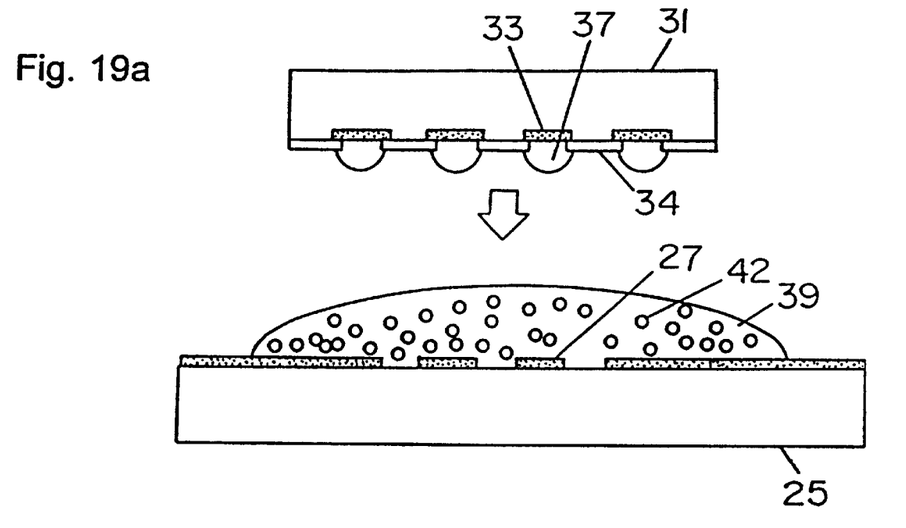
FIGS. 19a–19b show a process for connecting a semiconductor device and a circuit board according to an embodiment of the present invention.
Figure 19B:
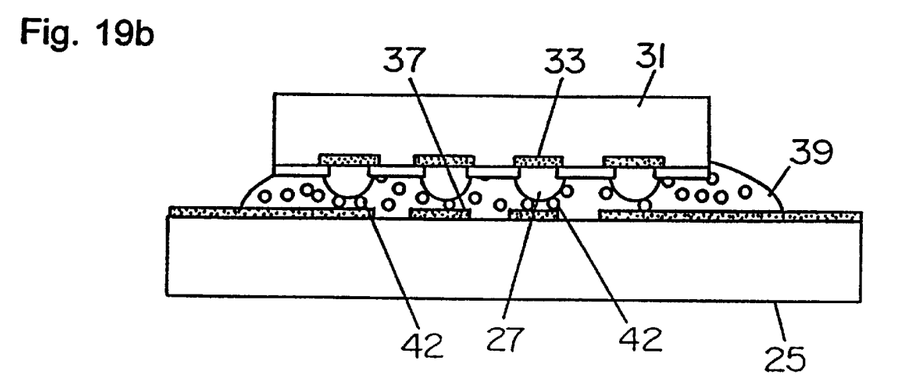

FIGS. 19a and 19b are side views showing a process wherein a semiconductor device is mounted on a circuit board. As shown in FIG. 19a, a semiconductor chip 31 and a circuit board 25 are disposed face to face, and protruding contacts 37 and substrate electrodes 27 are aligned. A thermosetting insulating resin 39 which contains a reducing agent 42 having a chunk shape, or the like, is applied on the circuit board 25 by dripping or other like method. And then, as shown in FIG. 19b, the semiconductor chip 31 is pressed against the circuit board 25, and the protruding contacts 37 contact the substrate electrodes 27. Reducing agent 42 contained in insulating resin 39 is held between the protruding contacts 37 and the substrate electrodes 27 and is crushed between the two. The reducing agent thus crushed disperses over each of the surfaces of protruding contacts 37 and substrate electrodes 27, and removes oxidized materials therefrom.

By heating the semiconductor chip 31 with protruding contacts 37 and substrate electrodes 27 contacting each other, the protruding contacts 37 and the substrate electrodes 27 are connected both physically and electrically by metal diffusion. The insulating resin 39 applied between protruding contacts 37 and substrate electrodes 27 are hardened at the same time. Although in the above described manufacturing process the semiconductor chip 31 is heated while being pressed, it is not essential to maintain the pressing force if the viscosity or the adhesion properties of insulating resin 39 is sufficiently high.

Heating may be applied, not to the semiconductor chip 31 alone, but also at the same time to both semiconductor chip 31 and circuit board 25. The reducing agent 42 mixed with the insulating resin 39 need not necessarily have a chunk shape. It may be mixed as a powder state or liquid contained in a capsule made from an insulating resin or a thermoplastic resin.

In a conventional process, the insulating resin is applied after the reducing agent provided on the surface of circuit board was washed off or volatilized. According to the above described preferred embodiment, however, the process for washing off or volatilizing the reducing agent is eliminated. As a result, there is no mechanical stress exerted on the protruding contacts due to washing, and there is no need to provide a clearance for discharging the volatilized substance. This is particularly advantageous for miniaturized semiconductor devices.

The invention may be also embodied in other specific forms without departing from the spirit or essential characteristics thereof.

As described in the foregoing, semiconductor devices according to the present invention comprise a barrier layer and a diffusion barrier layer formed only over an area confined by an opening in the protection layer. As a result, it is possible to make the size and the pitch of protruding contacts smaller. Further, because the hardness of the protruding contacts is preferably lower than that of the chip electrode and barrier layer, the risk of damage due to mechanical stress arising when a semiconductor device is mounted on a circuit board, and which would normally be transmitted to the active layer of a semiconductor chip, is alleviated.

In a structure where two semiconductor devices are combined, each of the protruding contacts of one device has a hardness different from that of each of the protruding contacts of the other device, such that one may be embedded into the other. Therefore, the risk of damage due to mechanical stress being transmitted to the active layer of semiconductor chip is alleviated.

Furthermore, when an insulating resin, used when coupling together two semiconductor devices or mounting a semiconductor device on a circuit board, contains a reducing agent, it is possible to obtain a combination of semiconductor devices in which neither washing the reduction agent nor discharging the volatilized reduction agent is needed.

What is claimed:

1. A method for manufacturing a semiconductor device, comprising the steps of:

forming, by electroless plating, a barrier layer and a flash-plated film for forming a diffusion barrier layer on a chip electrode exposed through an opening in a protection layer covering an active layer of a semiconductor chip; and forming a protruding contact on said film for forming a diffusion barrier layer, and forming a diffusion barrier layer, that is softer than the barrier layer, by mutual diffusion of said protruding contact and said film for forming a diffusion barrier layer.

2. A method for manufacturing a semiconductor device, comprising the steps of:

providing a first semiconductor device having a protruding contact formed thereon;

providing at least one of a circuit board and a second semiconductor device, having thereon a flash-plated film for forming a diffusion barrier layer;

abutting said protruding contact with said film for forming a diffusion barrier layer;

forming a diffusion barrier layer, that is softer than the barrier layer, by mutual diffusion of said protruding contact and said film for forming a diffusion barrier layer; and electrically coupling said first semiconductor device and said second semiconductor device by said protruding contact.

3. A method for manufacturing a semiconductor device, comprising the steps of:

forming a first relatively harder and a second relatively softer protruding contact on a first semiconductor device and on least one of a second semiconductor device and a circuit board, respectively;

aligning said first protruding contact with said second protruding contact; and permanently connecting said first and second protruding contacts together by pressing to embed at least a part of said first relatively harder protruding contact in said second relatively softer protruding contact.

4. The method of claim 3, further comprising the step of applying an insulating material around said first and second protruding contacts.

5. A method for manufacturing a semiconductor device, comprising the steps of:

forming a first relatively harder and a second relatively softer protruding contact on a first semiconductor device and on at least one of a second semiconductor device and a circuit board, respectively;

aligning said first protruding contact with said second protruding contact;

applying an insulating resin around at least one of said first and second protruding contacts;

permanently connecting said first and second protruding contacts together by pressing to embed at least a part of said first relatively harder protruding contact in said second relatively softer protruding contact; and hardening said insulating resin, whereby said first semiconductor device and said second semiconductor device or circuit board are adhered together and said first and second protruding contacts are sealed within the hardened insulating resin thereby electrically insulating said protruding contacts.

6. The method of claim 5, wherein said insulating resin is mixed with a reducing agent.

7. A method for manufacturing a semiconductor device, comprising the steps of:

abutting a protruding contact formed on a first semiconductor device with a substrate electrode of at least one of a second semiconductor device and a circuit board;

applying an insulating resin comprising a reducing agent on at least one of said protruding contact and said substrate electrode; and hardening the insulating resin.

* * * * *